(12) United States Patent
Behrendt et al.

(10) Patent No.: US 10,383,267 B2
(45) Date of Patent: Aug. 13, 2019

(54) METHOD OF ASSEMBLING AN ELECTRONIC SUBASSEMBLY FOR A PERSONAL CARE PRODUCT

(71) Applicant: The Gillette Company LLC, Boston, MA (US)

(72) Inventors: Juergen Behrendt, Niederbrechen (DE); Norbert Broemse, Bad Homburg (DE); Yvonne Scholl, Frankfurt (DE); Klaus Heubach, Koenigstein (DE); Fred Schnak, Kronberg im Taunus (DE)

(73) Assignee: The Gillette Company LLC, Boston, MA (US)

( * ) Notice: Subject to any disclaimer, the term of this patent is extended or adjusted under 35 U.S.C. 154(b) by 216 days.

(21) Appl. No.: 15/285,730

(22) Filed: Oct. 5, 2016

(65) Prior Publication Data

US 2017/0112027 A1 Apr. 20, 2017

(30) Foreign Application Priority Data

Oct. 15, 2015 (EP) .................................... 15190058

(51) Int. Cl.
*H05K 13/00* (2006.01)
*H05K 5/00* (2006.01)
(Continued)

(52) U.S. Cl.
CPC ........... *H05K 13/00* (2013.01); *B26B 21/405* (2013.01); *B26B 21/48* (2013.01); *B26B 21/528* (2013.01);
(Continued)

(58) Field of Classification Search
CPC .............. B26B 21/4012; B26B 21/405; B26B 21/4056; B26B 21/46; B26B 21/48; B26B 21/526; B26B 21/528; Y10T 29/49128; H05K 5/0026; H05K 5/003; H05K 5/0034; H05K 5/0039; H05K 5/006; H05K 5/0069; H05K 5/0095; H05K 5/0247; H05K 5/06; H05K 5/062; H05K 5/064; H05K 5/065; H05K 5/066; H05K 5/069; H05K 7/14;
(Continued)

(56) References Cited

U.S. PATENT DOCUMENTS

| 7,810,243 | B2 * | 10/2010 | Schnak | ................ B26B 21/526 30/44 |
| 2009/0071010 | A1 | 3/2009 | Hart | |
| 2011/0314677 | A1 * | 12/2011 | Meier | .................. A46B 5/0062 30/41.8 |

FOREIGN PATENT DOCUMENTS

KR 2007-0089345 8/2007

OTHER PUBLICATIONS

EPO Search Report with Written Opinion in corresponding EPO application 15190058.6 dated Aug. 24, 2016.

* cited by examiner

*Primary Examiner* — Peter DungBa Vo
*Assistant Examiner* — Joshua D Anderson
(74) *Attorney, Agent, or Firm* — John M. Lipchitz

(57) ABSTRACT

A method of assembling an electronic subassembly for a personal care product by manufacturing a hollow housing defining a chamber having a first open end and an opposing second open end. A rigid end of a first circuit board is inserted into the first open end of the housing. A second circuit board subassembly having a second circuit board is inserted into the chamber through the second open end. The first circuit board is connected to the second circuit board within the chamber of the housing.

11 Claims, 6 Drawing Sheets

(51) Int. Cl.
  *H05K 7/14* (2006.01)
  *B26B 21/48* (2006.01)
  *H05K 5/06* (2006.01)
  *B26B 21/40* (2006.01)
  *H05K 5/02* (2006.01)
  *B26B 21/52* (2006.01)

(52) U.S. Cl.
  CPC ......... *H05K 5/0026* (2013.01); *H05K 5/0039* (2013.01); *H05K 5/069* (2013.01); *H05K 7/1427* (2013.01); *B26B 21/526* (2013.01); *H05K 5/0247* (2013.01); *Y10T 29/49128* (2015.01)

(58) Field of Classification Search
  CPC .. H05K 7/1417; H05K 7/1418; H05K 7/1422; H05K 7/1427
  See application file for complete search history.

METHOD OF ASSEMBLING AN ELECTRONIC SUBASSEMBLY FOR A PERSONAL CARE PRODUCT

FIELD OF THE INVENTION

The present invention relates to electronic personal care products and more particularly to heated razors for wet shaving.

BACKGROUND OF THE INVENTION

Personal care products are becoming more advanced and thus often require the incorporation of electronic components to deliver new and/or improved consumer benefits. Electronic components are subject to failure when exposed to a wet environment, such as the bathroom. Furthermore, electronic components must be small to fit within a personal care product, such as a razor or a toothbrush. Accordingly, electrical components and fittings are typically very delicate and can break easily. In order to provide a safe and functional personal care product, the electrical components must be assembled and sealed against water ingress in a reliable cost effective manner.

Accordingly, there is a need to efficiently assemble and seal the electronic components of a personal care product in a simple and reliable manner.

SUMMARY OF THE INVENTION

The invention features, in general, a simple, efficient method of assembling an electronic subassembly for a personal care product by manufacturing a hollow housing defining a chamber having a first open end and an opposing second open end. A rigid end of a first circuit board is inserted into the first open end of the housing. A second circuit board subassembly having a second circuit board is inserted into the chamber through the second open end. The first circuit board is connected to the second circuit board within the chamber of the housing.

The invention also features, in general, a simple, efficient electronic subassembly for a personal care product with a housing defining a chamber having an open end. A first circuit board having a rigid end is positioned within the chamber and a flexible portion is positioned outside the chamber. A second circuit board is positioned within the chamber. The second circuit board has a connector dimensioned to receive the rigid end of the first circuit board.

The details of one or more embodiments of the invention are set forth in the accompanying drawings and the description below. It is understood that certain embodiments may combine elements or components of the invention, which are disclosed in general, but not expressly exemplified or claimed in combination, unless otherwise stated herein. Other features and advantages of the invention will be apparent from the description and drawings, and from the claims.

BRIEF DESCRIPTION OF THE DRAWINGS

While the specification concludes with claims particularly pointing out and distinctly claiming the subject matter that is regarded as the present invention, it is believed that the invention will be more fully understood from the following description taken in conjunction with the accompanying drawings.

DETAILED DESCRIPTION OF THE INVENTION

Figure 1:
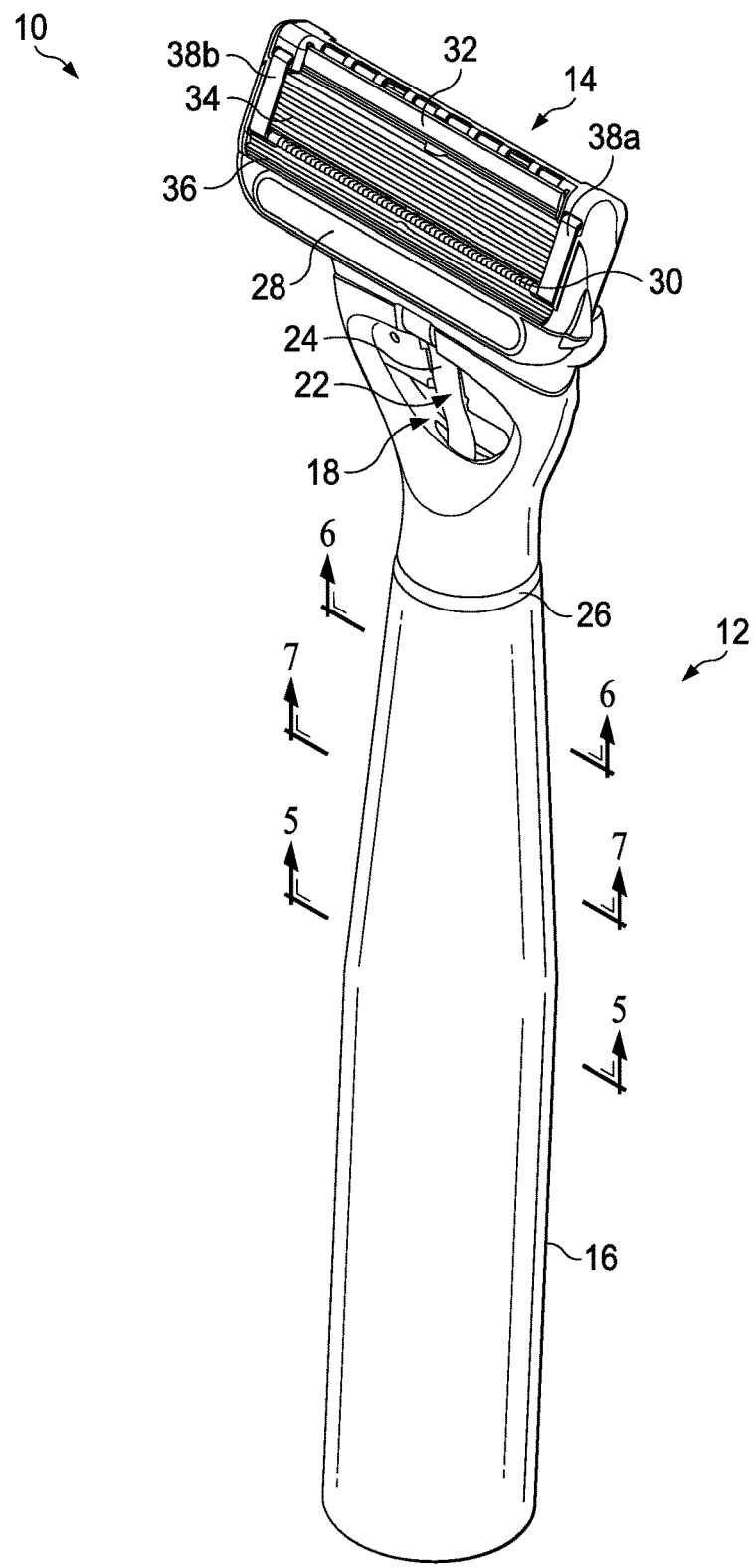
FIG. 1 is a perspective view of one possible embodiment of a personal care product.

Referring to FIG. 1, one possible embodiment of the present disclosure is shown illustrating a personal care product 10 having an electronic subassembly 12. Although the personal care product 10 shown is a wet shaving razor system, it is understood that other personal care products may include, but are not limited to a foil type shaving razor, a toothbrush, a shaving brush, a powered cleansing apparatus, an epilator, and other powered personal products. These products may be used in a wet environment, such as the bathroom. In certain embodiments, the personal care product 10 may include a cartridge 14 (e.g., a shaving razor cartridge) mounted to a housing 16. The housing 16 may act as a handle for a consumer to hold the personal care product 10. The housing 16 may be injection molded, machined or extruded.

As will be described in further detail below, the electronic subassembly 12 may comprises a first circuit board subassembly 18 and a second circuit board subassembly (not shown). The first circuit board subassembly 18 may include a first circuit board 22 having a flexible portion 24 and the housing 16 (e.g., a portion of the housing 16). At least a portion of the first circuit board 22 may be positioned inside the housing 16 and at least a portion of the first circuit board 22 (e.g., the flexible portion 24) may be positioned outside the housing 16. In certain embodiments, the first circuit board 22 may be secured within the housing 16 by a plug 26. As will be explained in greater detail below, the plug 26 may be part of the housing 16 and created as part of an injection molding process when the first circuit board 22 is assembled to the housing 16. The second circuit board subassembly (not shown) may be completely contained within the housing 16. Various electrical components may be contained within the housing 16 as part of the second circuit board subassembly (not shown). For example, the housing 16 may hold a power source, such as one or more batteries (not shown) that supply power from the second circuit board subassembly (not shown), to the first circuit board subassembly 18 and then to an electrical component 28 located outside the housing 16. In certain embodiments, the electrical component 28 may be a heating element located on a surface of the cartridge 14 or the housing 16 to deliver heat to the skin during shaving. However, the battery in addition to, or alternatively, may supply power to other electrical components including, but not limited to motors, cooling systems and/or lights.

The cartridge 14 may be permanently attached or removably mounted to the housing 16, thus allowing the cartridge 14 to be replaced. The cartridge 14 may have a guard 30, a cap 32 and one or more blades 34 mounted to the cartridge 14 between the cap 32 and the guard 30. The guard 30 may be toward a front portion of the cartridge 14 and the cap 30 may be toward a rear portion of the cartridge 14 (i.e., the guard 30 is in front of the blades 34 and the cap 32 is behind the blades 34). The guard 30 and the cap 32 may define a shaving plane that is tangent to the guard 30 and the cap 32. The guard 30 may be a solid or segmented bar that extends generally parallel to the blades 34.

In certain embodiments, the guard 30 may comprise a skin-engaging member 36 (e.g., a plurality of fins) in front of the blades 34 for stretching the skin during a shaving stroke. The skin-engaging member 36 may be insert injection molded or co-injection molded to the cartridge 14. However, other known assembly methods may also be used such as adhesives, ultrasonic welding, or mechanical fasteners. The skin engaging member 36 may be molded from a softer material (i.e., lower durometer hardness) than the cartridge 14. For example, the skin engaging member 36 may have a Shore A hardness of about 20, 30, or 40 to about 50, 60, or 70. A softer material may enhance skin stretching, as well as provide a more pleasant tactile feel against the skin of the user during shaving. A softer material may also aid in masking the less pleasant feel of the harder material of the cartridge 14 against the skin of the user during shaving.

In certain embodiments, the blades 34 may be mounted to the cartridge 14 and secured by one or more clips 38a and 38b. Other assembly methods known to those skilled in the art may also be used to secure and/or mount the blades 34 to the cartridge 14 including, but not limited to, wire wrapping, cold forming, hot staking, insert molding, ultrasonic welding, and adhesives. The clips 38a and 38b may comprise a metal, such as aluminum for acting as a sacrificial anode to help prevent corrosion of the blades 34. Although five blades 34 are shown, the cartridge 14 may have more or fewer blades depending on the desired performance and cost of the cartridge 14.

In certain embodiments, it may be desirable to provide heat in front of the blades 34. For example, the heating element 28 may be positioned in front of the guard 30 and/or the skin engaging member 36. The heating element 28 may comprise a skin contacting surface (e.g., a face plate) that delivers heat to a consumer's skin during a shaving stroke for an improved shaving experience. However, it is understood the heating element 28 may in addition to or alternatively supply heat to the blades 34, either directly or indirectly. The heating element 28 may be mounted to either the cartridge 14 or to a portion of the housing 16.

Figure 2A:
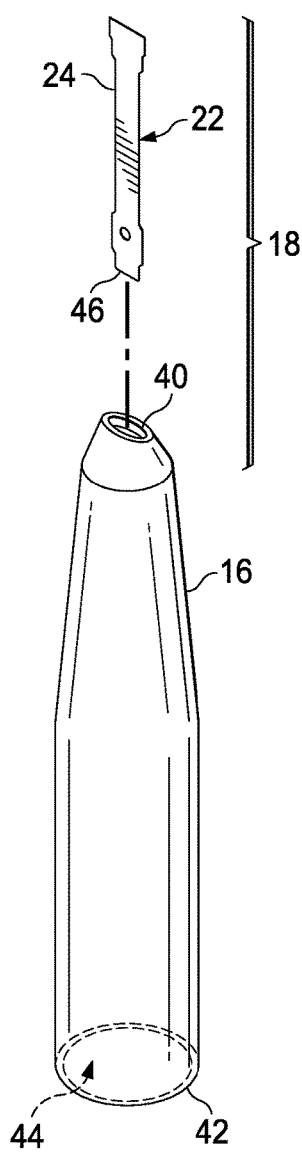
FIG. 2A is an assembly view of an electronic subassembly, which may be incorporated into the personal care product of FIG. 1

Referring to FIG. 2A, an assembly view of the first circuit board subassembly 18 is shown, which may be incorporated into the electronic subassembly 12 of the personal care product 10 shown in FIG. 1. The housing 16 may be hollow with a first open end 40 and a second open end 42. As will be explained in greater detail below, the second open end 42 may allow for assembly of various other electrical components within the housing 16. For example, the housing 16 may define a chamber 44 such that the second open end 42 receives the second circuit board assembly (not shown). The first open end 40 may allow for assembly of the first circuit board 22.

In certain embodiments, the housing 16 may be first manufactured by an injection molding process. The housing 16 and the first circuit board 22 may then be interconnected as part of a second manufacturing operation. The first circuit board 22 may have a rigid end 46 at one end of the flexible portion 24. The rigid end 46 may be a separate component that is mounted to the flexible portion to add stiffness and rigidity. A portion of the first circuit board 22 (e.g., the rigid end 46) may be placed in an injection mold along with the housing 16 and plastic (e.g., the plug 26) may be injected around a portion (e.g., the rigid end 46) of the first circuit board 22. The plug 26 and the housing 16 may comprise the same material such that the two components form a strong bond when molded together.

Figure 2B:
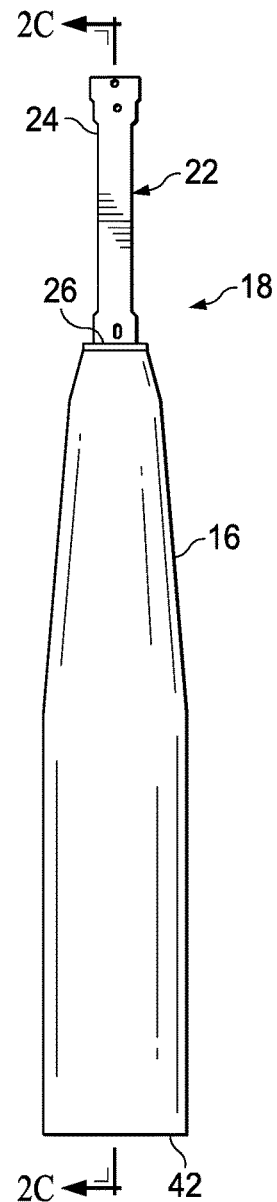
FIG. 2B is a side view of the electronic subassembly of FIG. 2A

As shown in FIG. 2B, the plastic plug 26 interconnects and seals the area between the first circuit board 22 (e.g., rigid end 46) and the housing 16. Accordingly, the flexible portion 24 may extend outside of the housing 16 to allow for connection to other electrical components.

Figure 2C:
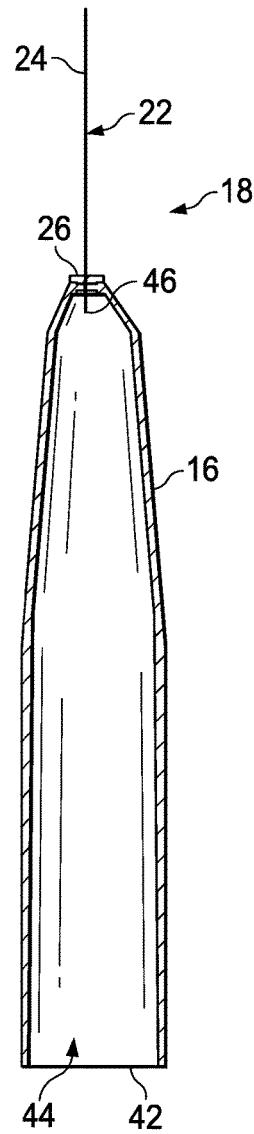
FIG. 2C is a cross section view of the electronic subassembly, taken generally along the line 2B-2B of FIG. 2A.

FIG. 2C is a cross section view of the first circuit board subassembly 18, taken generally along the line 2C-2C of FIG. 2B. As shown in FIG. 2C, a portion of the rigid end 46 may be exposed within the housing 16 (e.g., not covered in plastic) to allow for the connection with other electronic components. The rigid end 46 may be suspending (e.g., unsupported) and extend into the chamber 44 of the housing 16. The rigid end 46 may be sufficiently stiff such that it does not deflect once assembled (e.g., via insert molding) within the housing 16. If the rigid end 46 deflects, it may be difficult to align and/or connect other electrical components to the rigid end 46 from within the housing 14. This process may allow not only for sealing one end of the housing 16 form water ingress, but may also allow for the precise positioning of the rigid end 46 within the housing 16. If the rigid end 46 is not positioned properly within the housing 16, other electrical components may be impossible to assemble to the first circuit board 22.

However, there are alternative embodiments of how to assembly the first circuit board subassembly 18. For example, the first circuit board 22 may be placed in a mold and the housing 16 and the plug 26 may be molded to the first circuit board 22 in a single step. Alternatively, the first circuit board 22 may be insert molded with the plug 26 and then assembled to the housing 16 in a later assembly step. For example, the plug 26 may be inserted into the opening 40 of the housing 16 and sealed using an O-ring (not shown). The first circuit board 22 may also be insert molded with the housing 16 in a single step.

Figure 3:
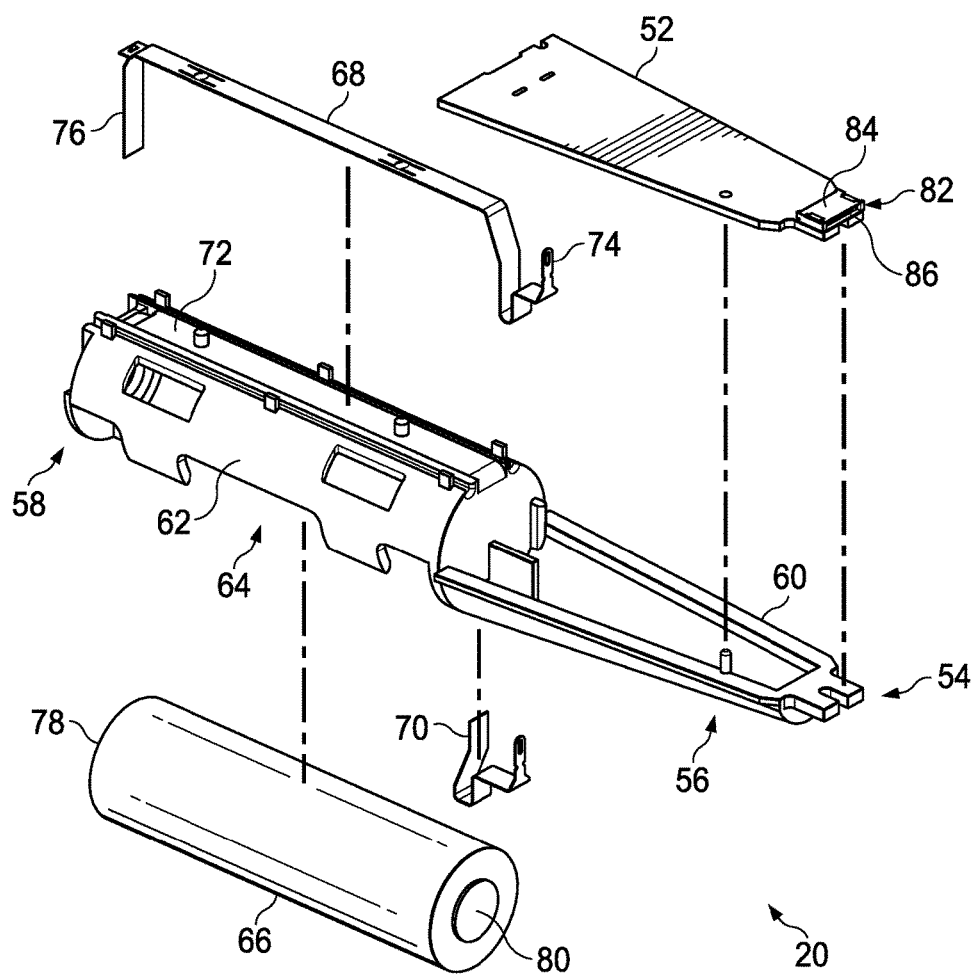
FIG. 3 is an assembly view of a second electronic subassembly, which may be incorporated into the personal care product of FIG. 1

Referring to FIG. 3, an assembly view of a portion of the second circuit board subassembly 20 is illustrated. The second circuit board subassembly 20 may include a second circuit board 52 and a chassis 54. The chassis 54 may have a first end 56 and a second end 58. The first end 56 may include a platform 60 and the second end 58 may include a battery housing 62. The platform 60 may be flat such that the second circuit board 52 can be securely mounted to the chassis 54 (i.e., the platform 60). The battery housing 62 may be generally cylindrical and define an opening 64 dimensioned to receive one or more batteries 66. The opening 64 may face in an opposite direction of the platform 60 to maximize space. In certain embodiments, the battery 66 may include a rechargeable battery. One or more electrical connectors 68, 70 may be used to transfer current from the battery 66 to the second circuit board 52. The one or more electrical connectors 68, 70 may include power rails, clips and/or wires. The battery housing 62 may define a channel 72 dimensioned to receive one of the electrical connectors 68. A first end 74 of the electrical connector 68 may couple to the second circuit board 52 and a second end 76 of the electrical connector 68 may couple to a terminal 78 of the battery 66. The other connector 70 may be used to provide an electrical connection between a second terminal 80 of the battery 66 and the circuit board 52. A proximal end 82 of the second circuit board 52 may have a connector 84 with an opening 86 dimensioned to receive the rigid end 46 of the first circuit board 18 (not shown).

Figure 4:
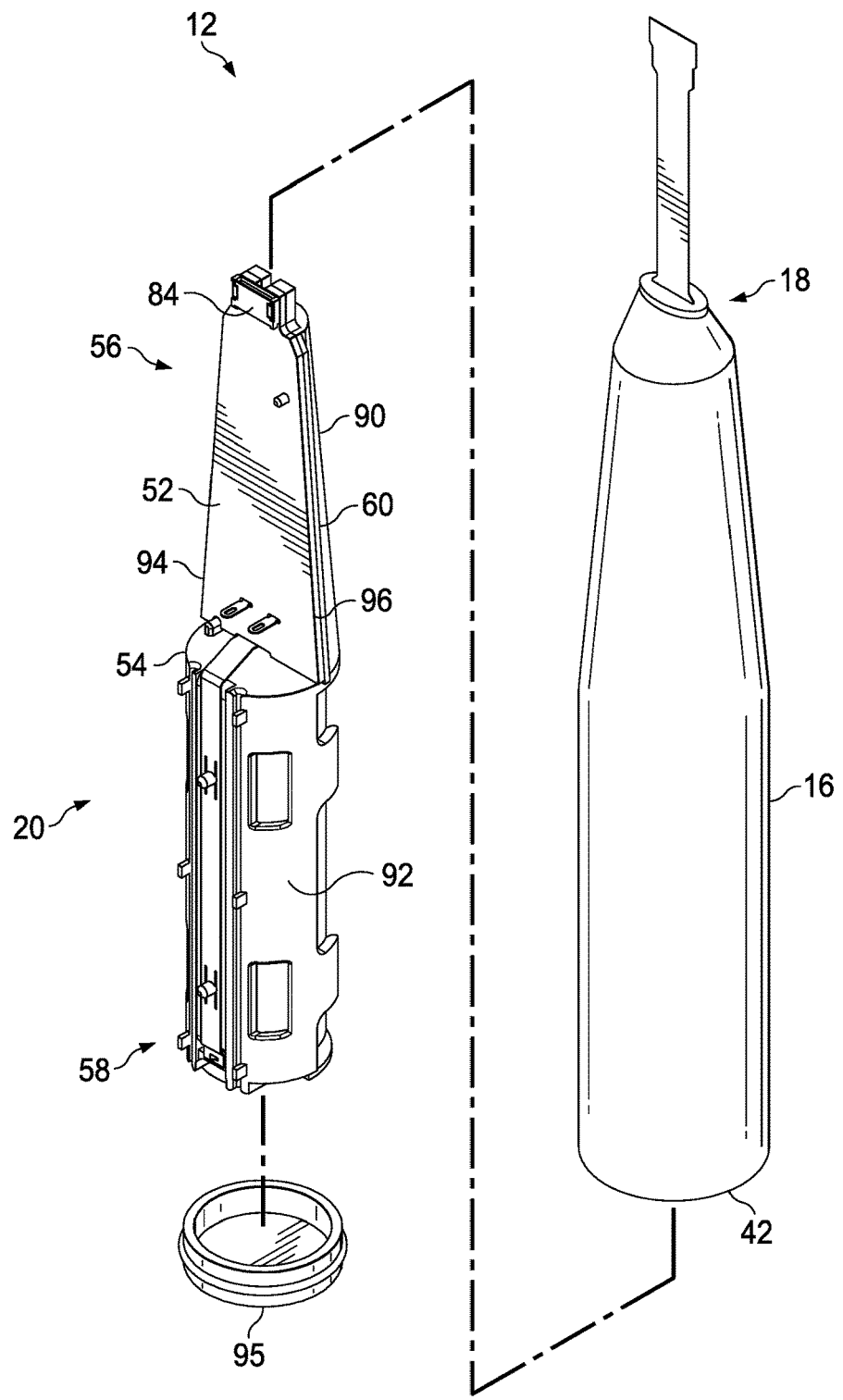
FIG. 4 is an assembly view of the electronic subassembly of FIG. 3 and the electronic sub assembly of FIG. 2B.

Referring to FIG. 4, an assembly view of the second circuit board subassembly 20 into the housing 16 is shown. The chassis 54 may be dimensioned to allow for easy insertion of the second circuit board subassembly 20 into the open end 42 the housing 16. For example, the first and second ends 56 and 58 of the chassis 54 may both have a convex surface 90 and 92 that corresponds to the geometry of the chamber 44 (not shown) of the housing 16 to help align the connector 84 of the second circuit board 52 with the rigid end 46 (not shown) of the first circuit board assembly 18 hidden within the housing 16. The convex surfaces 90 and 92 may face in opposite directions to allow for additional room for the mounting of the second circuit board 52 to the platform 60. In addition, the first end 56 of the chassis 54 may be tapered to guide the second circuit board subassembly 20 into the second opening 42 of the housing 16 and properly align connector 84 within the housing 16. As will be described in greater detail below, the chassis 54 (e.g., the second circuit board 52 and/or the platform 60) may include one or more guide members 94, 96, such as rails and/or grooves to facilitate the precise positioning of the chassis 54, and thus the connector 84 within the housing 16 (not shown).

Figure 5:
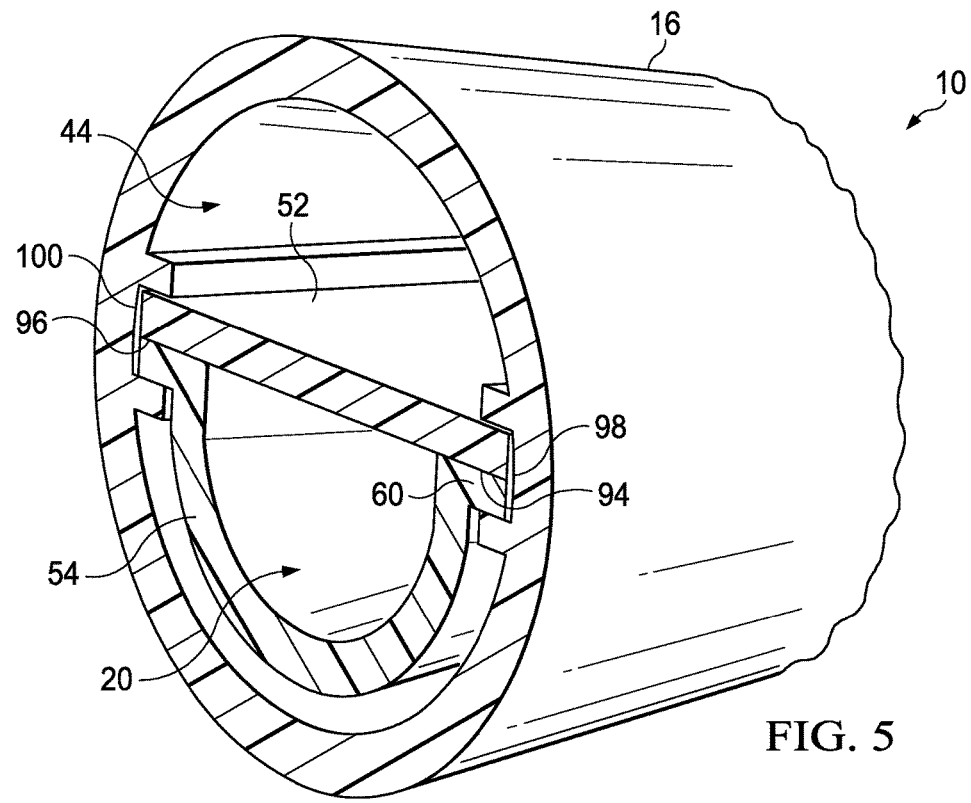
FIG. 5 is a partial cross section view of the personal care product, taken generally along the line 5-5 of FIG. 1.

FIG. 5 is a partial cross section view of the personal care product 10, taken generally along the line 5-5 of FIG. 1. The housing 16 may define the chamber 44 dimensioned to receive the second circuit board subassembly 20. The guide members 94 and 96 may engage a pair of respective guide members 98 and 100, such as channels defined by an inner surface of the housing 16. The channels 98 and 100 may provide sufficient clearance to allow the chassis 54 to easily slide within the housing 16 and guide the connector 84 in very close proximity to the rigid end 46 of the first circuit board 22 (not shown). Accordingly, as previously shown, the guide members 98 and 100 facilitate the self alignment of the second circuit board 52 and the connector 84 within the chamber 44 of the housing 16. As will be explained in greater detail below, the final position of the connector 84 within the housing 16 may be facilitated by other features of the housing 16.

Figure 6:
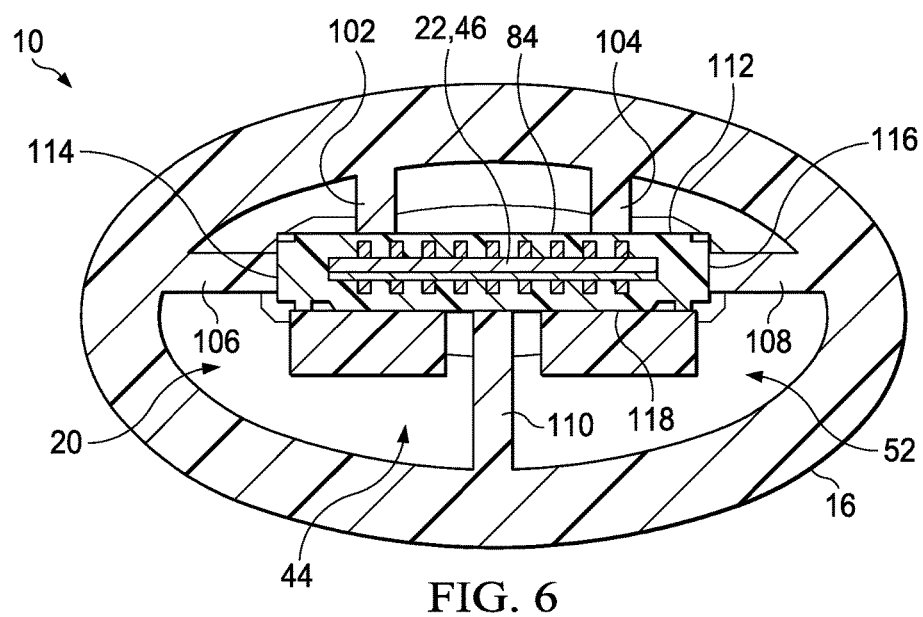
FIG. 6 is a partial cross section view of the personal care product, taken generally along the line 6-6 of FIG. 1.
Figure 7:
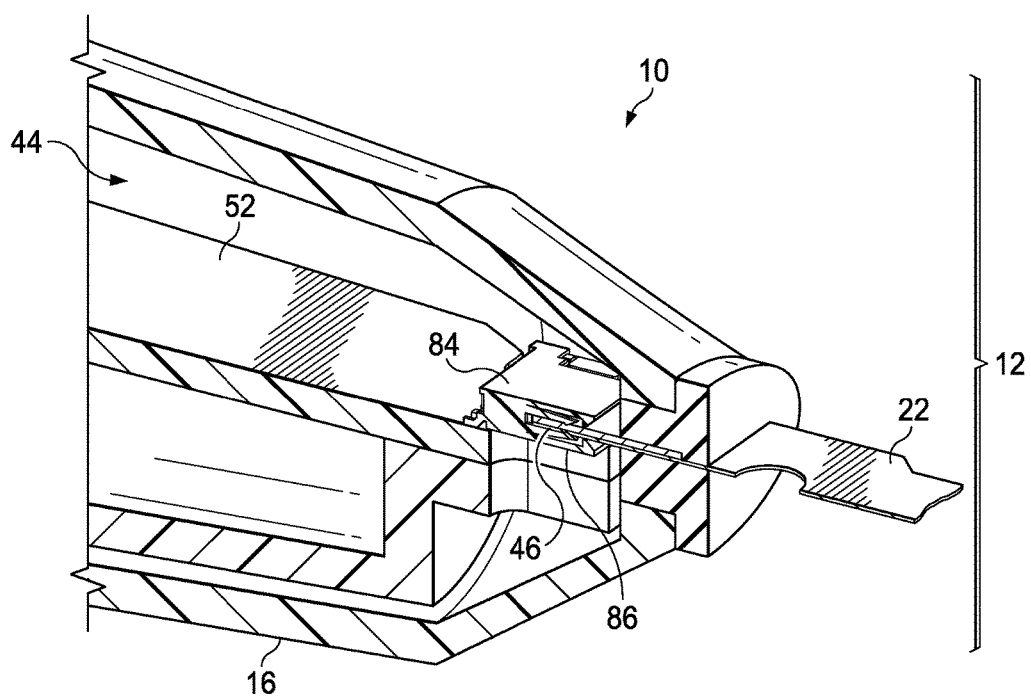
FIG. 7 is a partial cross section view of the personal care product, taken generally along the line 7-7 of FIG. 1.

Referring to FIGS. 6 and 7, the rigid end 46 is illustrated in its final assembled position within the connector 84. FIG. 6 is a partial cross section view of the personal care product 10, taken generally along the line 6-6 of FIG. 1. FIG. 7 is a partial cross section view of the personal care product 10, taken generally along the line 7-7 of FIG. 1. The second circuit board 52 is positioned within the chamber 44 of the housing 16 by sliding it in through the opening 42 (e.g., see FIG. 2A) and along the rails 98 and 100 (e.g., see FIG. 5). The housing 16 and the second circuit board 52 may self align during assembly such that the connector 84 is placed in close proximity with that the rigid end 46 of the first circuit board 22. As shown in FIG. 6, the housing 16 may have a plurality of ribs 102, 104, 106, 108 that support and guide the final connection of the second circuit board 52 (i.e., the connector 84) to the rigid end 46 of the first circuit board 22. The ribs 102 and 104 may guide a top surface 112 of the connector 84. The ribs 106 and 108 may guide a pair of side surfaces 114, 116 of the connector 84 and the rib 110 may guide a bottom surface 118 of the connector 84. The ribs 102, 104, 106, 108 and 110 facilitate precise alignment of the opening of the connector 84 with the rigid end 46. Accordingly, a technician can easily connect the first circuit board 22 to the second circuit board 52 without any visual aids (i.e., seeing the first circuit board 22 and the second circuit board 52 during the assembly process). The technician or assembly machine simply inserts the second circuit board into the chamber 44 of the housing 16 through the second opening 42 and the connector 84 is precisely aligned so the rigid end 46 slides within the opening of the connector 84. No special fixtures or equipment is needed to aid in assembly. The electronic subassembly 20 also eliminates the need to utilize a more complex and costly clam shell type housing, i.e. in two halves, to connect the electronic components because a technician does not need to see the first circuit board and the second circuit board in order to properly connect the two components. In addition, insert molding a portion of the first circuit board 22 within the housing 16, not only facilitates in alignment of the first circuit board 22 and the second circuit board 54 during assembly, but also creates a fluid seal preventing water ingress into the housing 16. In certain embodiments, the second electronic subassembly 20 may be spaced apart from the housing 16 to allow the rigid end 46 of the first circuit board 22 to fully seat within the opening 86 of the connector 84, thus providing a secure and reliable electrical connection. After the connector 84 and the rigid end 46 are connected, the end cap 95 (see FIG. 4) may be mounted to the housing 16 to provide a fluid seal.

COMBINATIONS

An example is below:
A. A method of assembling an electronic subassembly (12) for a personal care product (10) comprising:
   manufacturing a hollow housing (16) defining a chamber (44) having a first open end (40) and an opposing second open end (42);
   inserting a rigid end (46) of a first circuit board (22) into the first open end of the housing;
   inserting a second circuit board subassembly (20) having a second circuit board (52) into the chamber through the second open end; and
   connecting the first circuit board to the second circuit board within the chamber of the housing.
B. The method of Paragraph A further comprising assembling a first circuit board subassembly (18) by connecting the first circuit board (22) to the housing (16).
C. The method of Paragraph B wherein said connecting comprises molding plastic around a portion of the rigid end (46) of the first circuit board (18) to form a seal between the rigid end and the housing (16).
D. The method according to any one of Paragraphs A-C further comprising suspending a portion of the rigid end (46) within the chamber (44).
E. The method according to any one of Paragraphs A-D further comprising positioning a flexible portion of the first circuit board (22) outside of the housing (16).
F. The method according to any one of paragraphs A-E further comprising sealing the opposing second open end (42).
G. The method of Paragraph F wherein said sealing comprises mounting an end cap (95) to the housing (16).
H. The method according to any one of Paragraphs A-G wherein the first circuit board (22) is molded to the housing prior to inserting the second circuit board subassembly (20) into the chamber through the second open end.

I. The method according to any one of Paragraphs A-H wherein said connecting comprises inserting a rigid end (46) of the first circuit board (18) into a connector (84) of the second circuit board (52).

J. The method according to any one of Paragraphs A-I further comprising assembling the second circuit board subassembly (20) by mounting the second circuit board (52) to a platform (60) of a chassis (54).

K. The method of Paragraph J further comprising mounting a battery (66) to the chassis (54).

L. The method of Paragraph K wherein the battery (66) is mounted to the chassis (54) prior to inserting the second circuit board subassembly (20) into the housing (16).

M. The method of Paragraph A according to any one of the preceding claims further comprising aligning a connector (84) on the second circuit board (52) with the rigid end (46) of the first circuit board (22).

N. The method of Paragraph M wherein said aligning comprises engaging the second circuit board subassembly (20) with a plurality of ribs (102, 104, 106, 108, 110) of the housing (16).

O. The method according to any one of paragraphs A-N further comprising connecting a flexible portion (24) of the first circuit board subassembly (18) to a heating element (28) on a shaving razor cartridge (14).

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm".

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method of assembling an electronic subassembly for a powered personal care product comprising:
   manufacturing a hollow housing defining a chamber having a first open end and an opposing second open end;
   inserting a rigid end of a first circuit board into the first open end of the housing;
   inserting a second circuit board subassembly having a second circuit board into the chamber through the second open end; and
   connecting the first circuit board to the second circuit board within the chamber of the housing,
   further comprising assembling a first circuit board subassembly by connecting the first circuit board to the housing, wherein said connecting the first circuit board to the housing comprises molding plastic around a portion of the rigid end of the first circuit board to form a seal between the rigid end and the housing,
   wherein the first circuit board is molded to the housing prior to inserting the second circuit board subassembly into the chamber through the second open end, and
   further comprising sealing the opposing second open end.

2. The method of claim 1 further comprising suspending a portion of the rigid end within the chamber.

3. The method of claim 1 further comprising positioning a flexible portion of the first circuit board outside of the housing.

4. The method of claim 1 wherein said sealing comprises mounting an end cap to the housing.

5. The method of claim 1 wherein said connecting the first circuit board to the second circuit board comprises inserting a rigid end of the first circuit board into a connector of the second circuit board.

6. The method of claim 1 further comprising assembling the second circuit board subassembly by mounting the second circuit board to a platform of a chassis.

7. The method of claim 6 further comprising mounting a battery to the chassis.

8. The method of claim 7 wherein the battery is mounted to the chassis prior to inserting the second circuit board subassembly into the housing.

9. The method of claim 1 further comprising aligning a connector on the second circuit board with the rigid end of the first circuit board.

10. The method of claim 9 wherein said aligning comprises engaging the second circuit board subassembly with a plurality of ribs of the housing.

11. The method of claim 1 further comprising connecting a flexible portion of the first circuit board subassembly to a heating element on a shaving razor cartridge.

* * * * *